US011226557B2

(12) United States Patent
Jang et al.

(10) Patent No.: US 11,226,557 B2
(45) Date of Patent: *Jan. 18, 2022

(54) PHOTOPOLYMER COMPOSITION

(71) Applicant: LG CHEM, LTD., Seoul (KR)

(72) Inventors: Seokhoon Jang, Daejeon (KR); Hyunsup Lee, Daejeon (KR); Heon Kim, Daejeon (KR); Se Hyun Kwon, Daejeon (KR); Yeongrae Chang, Daejeon (KR)

(73) Assignee: LG CHEM, LTD., Seoul (KR)

( * ) Notice: Subject to any disclaimer, the term of this patent is extended or adjusted under 35 U.S.C. 154(b) by 64 days.

This patent is subject to a terminal disclaimer.

(21) Appl. No.: 16/607,588

(22) PCT Filed: Dec. 7, 2018

(86) PCT No.: PCT/KR2018/015467
§ 371 (c)(1),
(2) Date: Oct. 23, 2019

(87) PCT Pub. No.: WO2019/112358
PCT Pub. Date: Jun. 13, 2019

(65) Prior Publication Data
US 2020/0150528 A1 May 14, 2020

(30) Foreign Application Priority Data
Dec. 8, 2017 (KR) .................. 10-2017-0168049
Dec. 6, 2018 (KR) .................. 10-2018-0156152

(51) Int. Cl.
*G03F 7/004* (2006.01)
*G03H 1/02* (2006.01)
*C08L 51/08* (2006.01)
*C08L 83/12* (2006.01)
*G03F 7/00* (2006.01)
*C08L 75/04* (2006.01)

(52) U.S. Cl.
CPC .............. *G03F 7/001* (2013.01); *C08L 51/08* (2013.01); *C08L 75/04* (2013.01); *C08L 83/12* (2013.01); *G03H 1/0248* (2013.01); *G03H 2001/0264* (2013.01)

(58) Field of Classification Search
CPC ........... C08L 51/08; C08L 75/04; C08L 83/12
See application file for complete search history.

(56) References Cited

U.S. PATENT DOCUMENTS

| | | | | |
|---|---|---|---|---|
| 4,950,567 A | * | 8/1990 | Keys ................ | B32B 17/10036 430/1 |
| 2002/0192566 A1 | | 12/2002 | Elliott et al. | |
| 2003/0053392 A1 | | 3/2003 | Jeong | |
| 2006/0115740 A1 | | 6/2006 | Hayase et al. | |
| 2007/0243473 A1 | | 10/2007 | Mizushima et al. | |
| 2009/0034397 A1 | | 2/2009 | Tanaka | |
| 2010/0067073 A1 | | 3/2010 | Miki et al. | |
| 2010/0087564 A1 | | 4/2010 | Weiser et al. | |
| 2010/0123943 A1 | | 5/2010 | Umemoto et al. | |
| 2012/0164565 A1 | | 6/2012 | Qiu | |
| 2012/0214089 A1 | | 8/2012 | Hönel et al. | |
| 2012/0214090 A1 | | 8/2012 | Weiser et al. | |
| 2012/0219883 A1 | | 8/2012 | Bruder et al. | |
| 2012/0219884 A1 | | 8/2012 | Weiser et al. | |
| 2012/0231376 A1 | | 9/2012 | Rolle et al. | |
| 2012/0231377 A1 | | 9/2012 | Weiser et al. | |
| 2013/0224634 A1 | | 8/2013 | Berneth et al. | |
| 2013/0252140 A1 | | 9/2013 | Fäcke et al. | |
| 2014/0038084 A1 | | 2/2014 | Hönel et al. | |
| 2014/0302426 A1 | | 10/2014 | Hönel et al. | |
| 2015/0017353 A1 | | 1/2015 | Weiser et al. | |
| 2015/0125784 A1 | | 5/2015 | Weiser et al. | |
| 2016/0340548 A1 | | 11/2016 | Gubbels et al. | |
| 2019/0317404 A1 | * | 10/2019 | Jang ................ | C08L 43/04 |
| 2019/0339612 A1 | * | 11/2019 | Kim ................ | C08F 2/50 |
| 2020/0192218 A1 | * | 6/2020 | Jang ................ | G03F 7/0757 |
| 2020/0255623 A1 | * | 8/2020 | Jang ................ | C08G 18/6229 |
| 2020/0263038 A1 | * | 8/2020 | Kim ................ | G03F 7/105 |
| 2020/0355996 A1 | * | 11/2020 | Kim ................ | C08F 220/1804 |
| 2021/0003919 A1 | * | 1/2021 | Kim ................ | G03F 7/075 |
| 2021/0026239 A1 | * | 1/2021 | Kim ................ | G03H 1/02 |

FOREIGN PATENT DOCUMENTS

| | | |
|---|---|---|
| CN | 1405762 A | 3/2003 |
| CN | 1409861 A | 4/2003 |
| CN | 1815590 A | 8/2006 |
| CN | 1954271 A | 4/2007 |
| CN | 101359484 A | 2/2009 |
| CN | 101523305 A | 9/2009 |
| CN | 102792377 A | 11/2012 |
| EP | 2077471 A1 | 7/2009 |
| EP | 3514627 A1 | 7/2019 |
| JP | 09-106241 * | 4/1997 |
| JP | 2002-268523 A | 9/2002 |
| JP | 2002-297007 A | 10/2002 |
| JP | 2003-302726 A | 10/2003 |
| JP | 2003-316239 A | 11/2003 |
| JP | 2005-321673 A | 11/2005 |
| JP | 2007-086196 A | 4/2007 |
| JP | 2007-108256 A | 4/2007 |
| JP | 2007-139843 A | 6/2007 |

(Continued)

OTHER PUBLICATIONS

Machine translation of JP 09-106241 (1997).*

(Continued)

*Primary Examiner* — Martin J Angebranndt
(74) *Attorney, Agent, or Firm* — Rothwell, Figg, Ernst & Manbeck, P.C.

(57) ABSTRACT

The present disclosure relates to a hologram recording medium having a main relaxation temperature (Tr) of 0° C. or less, wherein the Tr is a point where a rate of change of phase angle with respect to temperature is the largest in a range of −80° C. to 30° C. in dynamic mechanical analysis. The present disclosure also relates to an optical element including the same and a holographic recording method using the hologram recording medium.

10 Claims, No Drawings

(56) References Cited

FOREIGN PATENT DOCUMENTS

| | | |
|---|---|---|
| JP | 2007-271823 A | 10/2007 |
| JP | 2008-134623 A | 6/2008 |
| JP | 2009-205137 A | 9/2009 |
| JP | 2010-237612 A | 10/2010 |
| JP | 2011-210335 A | 10/2011 |
| JP | 2011-221256 A | 11/2011 |
| JP | 2012-242692 A | 12/2012 |
| JP | 2013-510333 A | 3/2013 |
| JP | 2013-182040 A | 9/2013 |
| JP | 2013-543149 A | 11/2013 |
| JP | 2017-502147 A | 1/2017 |
| JP | 2017-078079 A | 4/2017 |
| JP | 6244204 B2 | 12/2017 |
| KR | 10-2009-0074019 A | 7/2009 |
| KR | 10-0934886 B1 | 1/2010 |
| KR | 10-2010-0037557 A | 4/2010 |
| KR | 10-2012-0101431 A | 9/2012 |
| KR | 10-2012-0101642 A | 9/2012 |
| KR | 10-2012-0101643 A | 9/2012 |
| KR | 10-2012-0101668 A | 9/2012 |
| KR | 10-2012-0107086 A | 9/2012 |
| KR | 10-2013-0006421 A | 1/2013 |
| KR | 10-2014-0110895 A | 9/2014 |
| WO | 2003-049097 A1 | 6/2003 |

OTHER PUBLICATIONS

Extended Search Report Issue for European Patent Application No. 18885464.0 dated Mar. 19, 2020, 6 pages.
PCT Search Report & Written Opinion issued for PCT/KR2018/015467 dated Mar. 25, 2019, 11 pages.

\* cited by examiner

PHOTOPOLYMER COMPOSITION

CROSS-REFERENCE TO RELATED APPLICATION

This application is a 35 U.S.C. 371 National Phase Entry Application from PCT/KR2018/015467, filed Dec. 7, 2018, which claims the benefits of Korean Patent Applications No. 10-2017-0168049 filed on Dec. 8, 2017 and No. 10-2018-0156152 filed on Dec. 6, 2018 with the Korean Intellectual Property Office, the disclosures of which are incorporated herein by reference in their entirety.

TECHNICAL FIELD

The present disclosure relates to a photopolymer composition, a hologram recording medium, an optical element and a holographic recording method.

BACKGROUND OF ART

Hologram recording medium records information by changing a refractive index in the holographic recording layer in the medium through an exposure process, reads the variation of refractive index in the medium thus recorded, and reproduces the information.

When a photopolymer (photosensitive resin) is used, the light interference pattern can be easily stored as a hologram by photopolymerization of the low molecular weight monomer. Therefore, the photopolymer can be used in various fields such as optical lenses, mirrors, deflecting mirrors, filters, diffusing screens, diffraction elements, light guides, waveguides, holographic optical elements having projection screen and/or mask functions, medium of optical memory system and light diffusion plate, optical wavelength multiplexers, reflection type, transmission type color filters, and the like.

Typically, a photopolymer composition for hologram production comprises a polymer binder, a monomer, and a photoinitiator, and the photosensitive film produced from such a composition is irradiated with laser interference light to induce photopolymerization of local monomers.

In a portion where a relatively large number of monomers are present in such photopolymerization process, the refractive index becomes high. And in a portion where a relatively large number of polymer binders are present, the refractive index is relatively lowered and thus the refractive index modulation occurs, and a diffraction grating is generated by such refractive index modulation. The refractive index modulation value (n) is influenced by the thickness and the diffraction efficiency (DE) of the photopolymer layer, and the anglular selectivity increases as the thickness decreases.

Recently, development of materials capable of maintaining a stable hologram with a high diffraction efficiency has been demanded, and also various attempts have been made to manufacture a photopolymer layer having a thin thickness and a high refractive index modulation value.

DETAILED DESCRIPTION OF THE INVENTION

Technical Problem

The present disclosure is to provide a hologram recording medium having a high refractive index modulation value with a thin thickness and improved durability against temperature and humidity.

The present disclosure is also to provide an optical element including the above-described hologram recording medium.

The present disclosure is also to provide a holographic recording method including selectively polymerizing photoreactive monomers contained in the hologram recording medium using a coherent laser.

Technical Solution

The present disclosure provides a hologram recording medium having a main relaxation temperature (Tr) of 0° C. or less, wherein the Tr is a point where a rate of change of phase angle with respect to temperature is the largest in a range of −80° C. to 30° C. in dynamic mechanical analysis.

The present disclosure also provides an optical element including the hologram recording medium.

The present disclosure also provides a holographic recording method including selectively polymerizing photoreactive monomers contained in the hologram recording medium using a coherent laser.

Hereinafter, the hologram recording medium, the optical element, and the holographic recording method according to a specific embodiment of the present invention will be described in more detail.

As used herein, the term "(meth)acrylate" refers to either methacrylate or acrylate.

As used herein, the term "(co)polymer" refers to either a homopolymer or copolymer (including random copolymers, block copolymers, and graft copolymers).

Further, the term "hologram" or "hologram recording medium" as used herein refers to a recording medium in which optical information is recorded in an entire visible range and a near ultraviolet range (300 to 800 nm) through an exposure process, and examples thereof include all of visual holograms such as in-line (Gabor) holograms, off-axis holograms, full-aperture transfer holograms, white light transmission holograms ("rainbow holograms"), Denisyuk holograms, off-axis reflection holograms, edge-lit holograms or holographic stereograms.

In the present disclosure, the alkyl group may be linear or branched, and the number of carbon atoms is not particularly limited, but is preferably 1 to 40. According to one embodiment, the alkyl group has 1 to 20 carbon atoms. According to another embodiment, the alkyl group has 1 to 10 carbon atoms. According to another embodiment, the alkyl group has 1 to 6 carbon atoms. Specific examples of the alkyl group include methyl, ethyl, propyl, n-propyl, isopropyl, butyl, n-butyl, isobutyl, tert-butyl, sec-butyl, 1-methylbutyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cycloheptylmethyl, octyl, n-octyl, tert-octyl, 1-methylheptyl, 2-ethylhexyl, 2-propylpentyl, n-nonyl, 2,2-dimethylheptyl, 1-ethylpropyl, 1,1-dimethyl-propyl, isohexyl, 2-methylpentyl, 4-methylhexyl, 5-methylhexyl, and the like, but are not limited thereto.

In the present disclosure, the alkylene group is a divalent functional group derived from alkane, and may be linear, branched, or cyclic. Specific examples thereof include a methylene group, an ethylene group, a propylene group, an isobutylene group, a sec-butylene group, a tert-butylene group, a pentylene group, a hexylene group, and the like.

According to one embodiment of the present disclosure, provided is a hologram recording medium having a main relaxation temperature (Tr) of 0° C. or less, wherein the Tr is a point where a rate of change of phase angle with respect to temperature is the largest in a range of −80° C. to 30° C. in dynamic mechanical analysis.

The present inventors have found through experiments that the hologram recording medium having a main relaxation temperature (Tr) of 0° C. or less, −15° C. or less, or −15 to −50° C. can exhibit high refractive index modulation values even with a thin thickness, thereby completing the present invention. As used herein, the Tr is a point where a rate of change of phase angle with respect to temperature is the largest in a range of −80° C. to 30° C. in dynamic mechanical analysis.

As described above, since the main relaxation temperature (Tr) is 0° C. or less, −15° C. or less, or −15 to −50° C., mobility of the components constituting the hologram recording medium is greatly improved even at room temperature, so that recording characteristics can be improved. Also, as mobility of the medium itself is increased, counter-diffusion of low refractive materials occurs in a direction opposite to the diffusion direction of the monomer, thereby maximizing the refractive index modulation value.

As is commonly known, the phase angle is an angular value of tan delta calculated as G"(loss modulus)/G'(storage modulus), which is measured by dynamic mechanical analysis.

As described above, the main relaxation temperature (Tr) is a point where a rate of change of phase angle with respect to temperature is the largest in a range of −80° C. to 30° C. in dynamic mechanical analysis. The phase angle is measured in DMA extension mode while giving a strain to a film-type hologram recording medium at a constant frequency. It is possible to calculate the rate of change of phase angle with respect to temperature by measuring the loss modulus and the storage modulus while changing the chamber temperature around the sample in a state where continuous deformation occurs.

The dynamic mechanical analysis may be performed using known devices and methods. Specifically, it may be performed under conditions of a strain of 0.1%, a frequency of 1 Hz, and a heating rate of 5° C./min.

The hologram recording medium may include a polymer matrix or a precursor thereof; and a photoreactive monomer.

The polymer matrix or the precursor thereof may serve as a support for the hologram recording medium and a final product produced therefrom, and the photoreactive monomer may serve as a recording monomer. When these are used, the photoreactive monomer is selectively polymerized on the polymer matrix during holographic recording, resulting in refractive index modulation due to a difference in the refractive index.

Specific examples of the polymer matrix or the precursor thereof are not particularly limited, as long as the main relaxation temperature (Tr) satisfies 0° C. or less, wherein the Tr is a point where a rate of change of phase angle with respect to temperature is the largest in a range of −80° C. to 30° C. in dynamic mechanical analysis.

In addition, the refractive index of the polymer matrix is not particularly limited, but may be 1.45 to 1.70, 1.455 to 1.60, or 1.46 to 1.53.

An example of the polymer matrix or the precursor thereof may be a polymer matrix containing a (meth)acrylate-based (co)polymer having a silane-based functional group in a branched chain and a silane cross-linking agent.

Holograms formed from the photopolymer composition including a polymer matrix or a precursor thereof including a (meth)acrylate-based (co)polymer having a silane-based functional group in a branched chain and a silane cross-linking agent can exhibit remarkably improved refractive index modulation values and excellent durability against temperature and humidity even in thinner thickness ranges as compared with holograms previously known in the art.

When using a polymer matrix or a precursor thereof including the silane cross-linking agent and the (meth)acrylate-based (co)polymer having a silane-based functional group in a branched chain, cross-linking density is optimized at the time of manufacturing a coating film or a hologram from the photopolymer composition, and excellent durability against temperature and humidity compared with the existing matrix can be secured. In addition, by optimizing the cross-linking density, mobility between the photoreactive monomer having a high refractive index and other components having a low refractive index may be increased, thereby maximizing the refractive index modulation and improving recording characteristics.

Particularly, a cross-linked structure mediated by a siloxane bond may be easily introduced between a modified (meth)acrylate-based (co)polymer containing a silane-based functional group and a silane cross-linking agent containing a terminal silane-based functional group through a sol-gel reaction, and the siloxane bond can provide excellent durability against temperature and humidity.

In the polymer matrix, the (meth)acrylate-based (co)polymer having a silane-based functional group in a branched chain and the silane cross-linking agent may be present as separate components, or in the form of a composite formed by reaction with each other.

A silane-based functional group may be located in a branched chain of the (meth)acrylate-based (co)polymer. The silane-based functional group may include a silane functional group or an alkoxysilane functional group, and preferably a trimethoxysilane group may be used as an alkoxysilane functional group.

The silane-based functional group may form a siloxane bond through a sol-gel reaction with the silane-based functional group contained in the silane cross-linking agent to cross-link the (meth)acrylate-based (co)polymer and the silane cross-linking agent.

The silane cross-linking agent may be a compound having an average of at least one silane-based functional group per molecule or a mixture thereof, and may be a compound containing at least one silane-based functional group. The silane-based functional group may include a silane functional group or an alkoxysilane functional group, and preferably a triethoxysilane group may be used as an alkoxysilane functional group. The silane-based functional group forms a siloxane bond through a sol-gel reaction with the silane-based functional group contained in the (meth)acrylate-based (co)polymer to cross-link the (meth)acrylate-based (co)polymer and the silane cross-linking agent.

Herein, the silane cross-linking agent may have an equivalent weight of the silane-based functional group of 200 g/ea to 1000 g/ea. Accordingly, cross-linking density between the (meth)acrylate-based (co)polymer and the silane cross-linking agent is optimized, so that excellent durability against temperature and humidity compared with the existing matrix can be secured. In addition, by optimizing the cross-linking density, mobility between the photoreactive monomer having a high refractive index and other components having a low refractive index can be increased, thereby maximizing the refractive index modulation and improving recording characteristics.

When the equivalent weight of the silane-based functional group contained in the silane cross-linking agent is excessively increased to 1000 g/ea or more, the diffraction grating interface after recording may collapse due to a decrease in the cross-linking density of the matrix. Further, loose cross-linking density and low glass transition temperature may cause the monomer and plasticizer components to be eluted onto the surface, thereby generating haze. When the equivalent weight of the silane-based functional group contained in the silane cross-linking agent is excessively decreased to less than 200 g/ea, the cross-linking density increases too high, which hinders mobility of the monomer and plasticizer components, thereby deteriorating recording characteristics.

More specifically, the silane cross-linking agent may include a linear polyether main chain having a weight average molecular weight of 100 to 2000, 300 to 1000, or 300 to 700, and a silane-based functional group bound to the main chain as a terminal group or a branched chain.

The linear polyether main chain having a weight average molecular weight of 100 to 2000 may include a repeating unit represented by the following Chemical Formula 3.

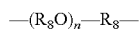   [Chemical Formula 3]

In Chemical Formula 3, $R_8$ is a C1 to C10 alkylene group, and n is an integer of 1 or more, 1 to 50, 5 to 20, or 8 to 10.

By introducing a flexible polyether polyol to the main chain of the silane cross-linking agent, the glass transition temperature and cross-linking density of the matrix may be controlled, resulting in improvement in mobility of the components.

Meanwhile, the bond between the silane-based functional group and the polyether main chain may be mediated by a urethane bond. Specifically, the silane-based functional group and the polyether main chain may form a mutual bond through a urethane bond. More specifically, a silicon atom contained in the silane-based functional group is bonded to a nitrogen atom of the urethane bond directly or via a C1 to C10 alkylene group, and a $R_8$ functional group contained in the polyether main chain may be directly bonded to an oxygen atom of the urethane bond.

The reason why the silane-based functional group and the polyether main chain are bonded through the urethane bond is that the silane cross-linking agent is produced by a reaction between an isocyanate compound containing a silane-based functional group and a linear polyether polyol compound having a weight average molecular weight of 100 to 2000.

More specifically, the isocyanate compound may include an aliphatic, cycloaliphatic, aromatic or aromatic-aliphatic mono-isocyanate, di-isocyanate, tri-isocyanate or poly-isocyanate; or oligo-isocyanate or poly-isocyanate of diisocyanate or triisocyante having urethane, urea, carbodiimide, acylurea, isocyanurate, allophanate, biuret, oxadiazinetrione, uretdione or iminooxadiazinedione structures.

A specific example of the isocyanate compound containing the silane-based functional group may be 3-isocyanatopropyltriethoxysilane (KBE-9007).

Further, the polyether polyol may be, for example, poly-addition products of styrene oxides, of ethylene oxide, of propylene oxide, of tetrahydrofuran, of butylene oxide, or of epichlorohydrin, mixed addition products thereof, grafting products thereof, polyether polyols obtained by condensation of polyhydric alcohols or mixtures thereof, and those obtained by alkoxylation of polyhydric alcohols, amines and amino alcohols.

Specific examples of the polyether polyols include poly(propylene oxide)s, poly(ethylene oxide)s and combinations thereof in the form of random or block copolymers, or poly(tetrahydrofuran)s and mixtures thereof having an OH functionality of 1.5 to 6 and a number average molecular weight of 200 to 18000 g/mol, preferably an OH functionality of 1.8 to 4.0 and a number average molecular weight of 600 to 8000 g/mol, particularly preferably an OH functionality of 1.9 to 3.1 and a number average molecular weight of 650 to 4500 g/mol.

When the silane-based functional group and the polyether main chain are bonded via a urethane bond, the silane cross-linking agent may be more easily synthesized.

The weight average molecular weight (measured by GPC) of the silane cross-linking agent may be 1000 to 5,000,000. The weight average molecular weight refers to a weight average molecular weight (unit: g/mol) using polystyrene calibration measured by a GPC method. In the process of measuring the weight average molecular weight using polystyrene calibration measured by a GPC method, a well-known analyzer, detector such as a refractive index detector, and analyzing column may be used. In addition, conventionally applied temperature conditions, solvents, and flow rates may be used. As a specific example of the measurement conditions, a temperature of 30° C., a chloroform solvent and a flow rate of 1 mL/min may be applied.

The (meth)acrylate-based (co)polymer may include a (meth)acrylate repeating unit in which a silane-based functional group is located in the branched chain, and a (meth)acrylate repeating unit.

An example of the (meth)acrylate repeating unit in which a silane-based functional group is located in the branched chain may be a repeating unit represented by the following Chemical Formula 1.

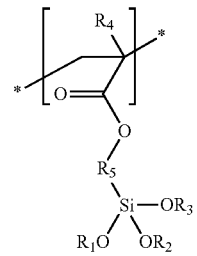

[Chemical Formula 1]

In Chemical Formula 1, $R_1$ to $R_3$ are each independently a C1 to C10 alkyl group, $R_4$ is hydrogen or a C1 to C10 alkyl group and $R_5$ is a C1 to C10 alkylene group.

Preferably, Chemical Formula 1 may be a repeating unit derived from 3-methacryloxypropyltrimethoxysilane (KBM-503) in which $R_1$ to $R_3$ are each independently a C1 methyl group, $R_4$ is a C1 methyl group and $R_5$ is a C3 propylene group, or a repeating unit derived from 3-acryloxypropyltrimethoxysilane (KBM-5103) in which $R_1$ to $R_3$ are each independently a C1 methyl group, $R_4$ is hydrogen and $R_5$ is a C3 propylene group.

In addition, an example of the (meth)acrylate repeating unit may be a repeating unit represented by the following Chemical Formula 2.

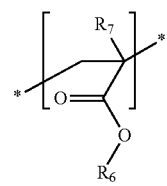

[Chemical Formula 2]

In Chemical Formula 2, $R_6$ is a C1 to C20 alkyl group, $R_7$ is hydrogen or a C1 to C10 alkyl group. Preferably, Chemical Formula 2 may be a repeating unit derived from butyl acrylate in which $R_6$ is a C4 butyl group and $R_7$ is hydrogen.

A molar ratio of the repeating unit of Chemical Formula 2 to the repeating unit of Chemical Formula 1 may be 0.5:1 to 14:1. When the molar ratio of the repeating unit of Chemical Formula 1 is excessively decreased, cross-linking density of the matrix becomes too low to serve as a support, and recording characteristics after recording may be deteriorated. When the molar ratio of the repeating unit of Chemical Formula 1 is excessively increased, cross-linking density of the matrix becomes too high and fluidity of the respective components may be decreased, resulting in a decrease in the refractive index modulation value.

The weight average molecular weight (measured by GPC) of the (meth)acrylate-based (co)polymer may be 100,000 to 5,000,000, or 300,000 to 900,000. The weight average molecular weight refers to a weight average molecular weight (unit: g/mol) using polystyrene calibration measured by a GPC method. In the process of measuring the weight average molecular weight using polystyrene calibration measured by a GPC method, a well-known analyzer, detector such as a refractive index detector, and analyzing column may be used. In addition, conventionally applied temperature conditions, solvents, and flow rates may be used. As a specific example of the measurement conditions, a temperature of 30° C., a chloroform solvent and a flow rate of 1 mL/min may be applied.

The (meth)acrylate-based (co)polymer may have an equivalent weight of the silane-based functional group of 300 g/ea to 2000 g/ea, 500 g/ea to 2000 g/ea, 550 g/ea to 1800 g/ea, 580 g/ea to 1600 g/ea, or 586 g/ea to 1562 g/ea. The equivalent weight corresponds to an average value of molecular weights between the silane functional groups. The smaller the equivalent weight is, the higher the density of the functional group is. And the larger the equivalent weight, the smaller the density of the functional group.

Accordingly, cross-linking density between the (meth)acrylate-based (co)polymer and the silane cross-linking agent is optimized, and excellent durability against temperature and humidity compared with the existing matrix can be secured. In addition, by optimizing the cross-linking density, mobility between the photoreactive monomer having a high refractive index and other components having a low refractive index can be increased, thereby maximizing the refractive index modulation and improving recording characteristics.

When the equivalent weight of the silane-based functional group contained in the (meth)acrylate-based (co)polymer is excessively decreased to less than 300 g/ea, cross-linking density of the matrix increases too high, which hinders mobility of the components, thereby deteriorating recording characteristics. When the equivalent weight of the silane-based functional group contained in the (meth)acrylate-based (co)polymer is excessively increased to more than 2000 g/ea, cross-linking density becomes too low to serve as a support, so that the diffraction grating interface generated after recording may collapse, thereby reducing the refractive index modulation value over time.

Meanwhile, 10 parts by weight to 90 parts by weight, 20 parts by weight to 70 parts by weight, or 22 parts by weight to 65 parts by weight of the silane cross-linking agent may be included based on 100 parts by weight of the (meth)acrylate based (co)polymer.

In the reaction product, when the silane cross-linking agent content is excessively decreased with respect to 100 parts by weight of the (meth)acrylate-based (co)polymer, the curing rate of the matrix is significantly slowed to lose its function as a support, and the diffraction grating interface may collapse easily. When the silane cross-linking agent content is excessively increased, the curing rate of the matrix is accelerated, but an excessive increase in the reactive silane group content causes compatibility problems with other components, resulting in haze.

In addition, the modulus (storage modulus) of the reaction product may be 0.01 MPa to 5 MPa. For example, the storage modulus (G') may be measured at a frequency of 1 Hz at room temperature (20° C. to 25° C.) using discovery hybrid rheometer (DHR) manufactured by TA Instruments.

Also, the glass transition temperature of the reaction product may be −40° C. to 10° C. For example, the glass transition temperature may be obtained by measuring a change in phase angle (loss modulus) of the film coated with the photopolymer composition using a dynamic mechanical analysis (DMA) apparatus at a temperature of −80° C. to 30° C. under the setting conditions of strain 0.1%, frequency 1 Hz, and heating rate 5° C./min.

Another example of the polymer matrix or the precursor thereof may be a polymer matrix including a reaction product of a compound having at least one isocyanate group and a polyol.

The compound having at least one isocyanate group may be a known compound having an average of at least one NCO functional group per molecule or a mixture thereof, and may be a compound having at least one isocyanate group.

More specifically, the compound having at least one isocyanate group is an aliphatic, cycloaliphatic, aromatic or aromatic-aliphatic mono-, di-, tri- or poly-isocyanate. The compound having at least one isocyanate group may be secondary products with relatively high molecular weight (oligo- and poly-isocyanates) of monomer-type di- and/or tri-isocyanates having urethane, urea, carbodiimide, acylurea, isocyanurate, allophanate, biuret, oxadiazinetrione, uretdione or iminooxadiazinedione structures.

Specific examples of the compound having at least one isocyanate group include butylene diisocyanate, hexamethylene diisocyanate (HDI), isophorone diisocyanate (IPDI), 1,8-diisocyanato-4-(isocyanatomethyl)octane, 2,2,4- and/or 2,4,4-trimethylhexamethylene diisocyanate, isomeric bis(4, 4'-isocyanato-cyclohexyl)methane, a mixture thereof with any desired isomer content, isocyanatomethyl-1,8-octane diisocyanate, 1,4-cyclohexylene diisocyanate, isomeric cyclohexane dimethylene diisocyanate, 1,4-phenylene diisocyanate, 2,4- and/or 2,6-toluene diisocyanate, 1,5-naphthylene diisocyanate, 2,4'- or 4,4'-diphenylmethane diisocyanate and/or triphenylmethane 4,4',4"-triisocyanate or the like.

The polyol which react with the compound having at least one isocyanate group to form the polymer matrix may be an aliphatic, aromatic-aliphatic or cycloaliphatic diol, triol and/or higher polyol having 2 to 20 carbon atoms.

The polyol may have a hydroxyl equivalent weight of 300 g/mol to 10,000 g/mol, and a weight average molecular weight of 100,000 to 1,500,0000 g/mol.

Examples of the diols include ethylene glycol, diethylene glycol, triethylene glycol, tetraethylene glycol, dipropylene glycol, tripropylene glycol, 1,2-propanediol, 1,3-propanediol, 1,4-butanediol, neopentyl glycol, 2-ethyl-2-butylpropanediol, trimethylpentanediol, positional isomers of diethyloctanediols, 1,3-butylene glycol, cyclohexanediol, 1,4-cyclohexane-dimethanol, 1,6-hexanediol, 1,2- and 1,4-cyclohexanediol, hydrogenated bisphenol A (2,2-bis(4- hydroxycyclohexyl)propane) and 2,2-dimethyl-3-hydroxypropyl, and 2,2-dimethyl-3-hydroxypropionate.

Further, examples of the triols include trimethylolethane, trimethylolpropane or glycerol. Suitable high-functional alcohols include ditrimethylolpropane, pentaerythritol, di pentaerythritol and sorbitol.

As the polyols, aliphatic and cycloaliphatic polyols having a relatively large molecular weight, such as polyester polyols, polyether polyols, polycarbonate polyols, hydroxy-functional acrylic resins, hydroxy-functional polyurethanes, hydroxy-functional epoxy resins and the like may be used.

The polyester polyols may be linear polyester diols, as obtained in a known manner from aliphatic, cycloaliphatic or aromatic di- or polycarboxylic acid or their anhydride, for example, succinic acid, glutaric acid, adipic acid, pimelic acid, suberic acid, azelaic acid, sebacic acid, nonanedicarboxylic acid, decanedicarboxylic acid, terephthalic acid, isophthalic acid, o-phthalic acid, tetrahydrophthalic acid, hexahydrophthalic acid or trimellitic acid, and acid anhydrides such as o-phthalic anhydride, trimellitic anhydride or succinic anhydride, or any mixtures thereof, by using polyhydric alcohols such as ethanediol, di-, tri- or tetraethylene glycol, 1,2-propanediol, di-, tri- or tetrapropylene glycol, 1,3-propanediol, 1,4-butanediol, 1,3-butanediol, 2,3-butanediol, 1,5-pentanediol, 1,6-hexanediol, 2,2-dimethyl-1,3-propanediol, 1,4-dihydroxycyclohexane, 1,4-dimethylolcyclohexane, 1,8-octanediol, 1,10-decanediol, 1,12-dodecanediol, or a mixture thereof, and optionally, simultaneously using higher functional polyols such as trimethylol propane or glycerol. Of course, cyclic aliphatic and/or aromatic di- and polyhydroxy compounds are suitable as polyhydric alcohols for the preparation of polyester polyols. It is also possible to use the corresponding polycarboxylic acid anhydrides of the lower alcohols or the corresponding polycarboxylates, or mixtures thereof, instead of free polycarboxylic acids in the preparation of the polyesters.

Further, the polyester polyols that can be used in the synthesis of the polymer matrix include homo- or copolymers of lactones, which are preferably obtained by an addition of lactones or lactone mixtures, such as butyrolactone, ε-caprolactone and/or methyl-ε-caprolactone to suitable bifunctional and/or higher functional initiator molecules, such as the aforementioned polyhydric alcohols having a small molecular weight as the synthetic component for the polyester polyols.

Further, the polycarbonates having hydroxyl groups are also suitable as a polyhydroxy component for prepolymer synthesis. For example, it may be prepared by reaction of diols such as 1,4-butanediol and/or 1,6-hexanediol and/or 3-methylpentanediol with diaryl carbonates such as diphenyl carbonate, dimethyl carbonate or phosgene.

Further, the polyether polyol that can be used for the synthesis of the polymer matrix may be, for example, polyaddition products of styrene oxides, of ethylene oxide, of propylene oxide, of tetrahydrofuran, of butylene oxide, or of epichlorohydrin, mixed addition products thereof, grafting products thereof, polyether polyols obtained by condensation of polyhydric alcohols or mixtures thereof, and those obtained by alkoxylation of polyhydric alcohols, amines and amino alcohols. Specific examples of the polyether polyol include poly(propylene oxide)s, poly(ethylene oxide)s and combinations thereof in the form of random or block copolymers, or poly(tetrahydrofuran)s and mixtures thereof having an OH functionality of 1.5 to 6 and a number average molecular weight of 200 to 18000 g/mol, preferably an OH functionality of 1.8 to 4.0 and a number average molecular weight of 600 to 8000 g/mol, particularly preferably an OH functionality of 1.9 to 3.1 and a number average molecular weight of 650 to 4500 g/mol.

The photoreactive monomer may include a polyfunctional (meth)acrylate monomer or a monofunctional (meth)acrylate monomer.

As described above, in a portion where the monomer is polymerized in the process of photopolymerization of the photopolymer composition and the polymer is present in relatively large amounts, the refractive index becomes high. In a portion where the polymer binder is present in relatively large amounts, the refractive index becomes relatively low, the refractive index modulation occurs, and a diffraction grating is generated by such refractive index modulation.

Specifically, an example of the photoreactive monomer may include (meth)acrylate-based $\alpha,\beta$-unsaturated carboxylic acid derivatives, for example, (meth)acrylate, (meth)acrylamide, (meth)acrylonitrile, (meth)acrylic acid or the like, or a compound containing a vinyl group or a thiol group.

An example of the photoreactive monomer may include a polyfunctional (meth)acrylate monomer having a refractive index of 1.5 or more, 1.53 or more, or 1.5 to 1.7. The polyfunctional (meth)acrylate monomer having a refractive index of 1.5 or more, 1.53 or more, or 1.5 to 1.7 may include a halogen atom (bromine, iodine, etc.), sulfur (S), phosphorus (P), or an aromatic ring.

More specific examples of the polyfunctional (meth)acrylate monomer having a refractive index of 1.5 or more include bisphenol A modified diacrylate type, fluorene acrylate type (HR6022 etc. manufactured by Miwon Specialty Chemical Co., Ltd.), bisphenol fluorene epoxy acrylate type (HR6100, HR6060, HR6042, etc. manufactured by Miwon Specialty Chemical Co., Ltd.), halogenated epoxy acrylate type (HR1139, HR3362, etc. manufactured by Miwon Specialty Chemical Co., Ltd.), and the like.

Another example of the photoreactive monomer may include a monofunctional (meth)acrylate monomer. The monofunctional (meth)acrylate monomer may contain an ether bond and a fluorene functional group in the molecule. Specific examples thereof include phenoxybenzyl (meth)acrylate, o-phenylphenol ethylene oxide (meth)acrylate, benzyl (meth)acrylate, 2-(phenylthio)ethyl (meth)acrylate, biphenylmethyl (meth)acrylate, or the like.

Meanwhile, the photoreactive monomer may have a weight average molecular weight of 50 g/mol to 1000 g/mol, or 200 g/mol to 600 g/mol. The weight average molecular weight refers to a weight average molecular weight using polystyrene calibration measured by a GPC method.

Meanwhile, the hologram recording medium of the embodiment includes a photoinitiator. The photoinitiator is a compound which is activated by light or actinic radiation and initiates polymerization of a compound containing a photoreactive functional group such as the photoreactive monomer.

As the photoinitiator, commonly known photoinitiators can be used without particular limitation, but specific examples thereof include a photoradical polymerization initiator, a photocationic polymerization initiator and a photoanionic polymerization initiator.

Specific examples of the photoradical polymerization initiator include imidazole derivatives, bisimidazole derivatives, N-aryl glycine derivatives, organic azide compounds, titanocene, aluminate complex, organic peroxide, N-alkoxy-pyridinium salts, thioxanthone derivatives, amine derivatives, and the like. More specifically, examples of the photoradical polymerization initiator include 1,3-di(t-butyldioxycarbonyl)benzophenone, 3,3',4,4"-tetrakis(t-butyldioxycarbonyl)benzophenone, 3-phenyl-5-isoxazolone, 2-mercapto benzimidazole, bis(2,4,5-triphenyl)imidazole, 2,2-dimethoxy-1,2-diphenylethane-1-one (product name: Irgacure 651/manufacturer: BASF), 1-hydroxy-cyclohexyl-phenyl-ketone (product name: Irgacure 184/manufacturer: BASF), 2-benzyl-2-dimethylamino-1-(4-morpholinophenyl)-butanone-1 (product name: Irgacure 369/manufacturer: BASF), bis(η5-2,4-cyclopentadiene-1-yl)-bis(2,6-difluoro-3-(1H-pyrrole-1-yl)-phenyl)titanium (product name: Irgacure/784 manufacturer: BASF), Ebecryl P-115 (manufacturer: SK entis), and the like.

The photocationic polymerization initiator may include a diazonium salt, a sulfonium salt, or an iodonium saltm, and examples thereof include sulfonic acid esters, imidosulfonates, dialkyl-4-hydroxysulfonium salts, arylsulfonic acid-p-nitrobenzyl esters, silanol-aluminum complexes, (η6-benzene) (η5-cyclopentadienyl)iron (II), and the like. In addition, benzoin tosylate, 2,5-dinitrobenzyltosylate, N-tosylphthalic acid imide, and the like can be used. More specific examples of the photocationic polymerization initiator include commercially available products such as Cyracure UVI-6970, Cyracure UVI-6974 and Cyracure UVI-6990 (manufacturer: Dow Chemical Co. in USA), Irgacure 264 and Irgacure 250 (manufacturer: BASF) or CIT-1682 (manufacturer: Nippon Soda).

The photoanionic polymerization initiator may include a borate salt, and examples thereof include butyryl chlorine butyltriphenyl borate. More specific examples of the photoanionic polymerization initiator include commercially available products such as Borate V (manufacturer: Spectra group).

In addition, the photopolymer composition of the embodiment may include a monomolecular (type I) initiator or a bimolecular (type II) initiator. The (type I) system for free radical photopolymerization may include, for example, an aromatic ketone compounds in combination with a tertiary amine, such as benzophenone, alkylbenzophenone, 4,4'-bis(dimethylamino)benzophenone (Michler's ketone), anthrone and halogenated benzophenone or a mixture of these types. The bimolecular (type II) initiator may include benzoin and derivatives thereof, benzyl ketal, acylphosphine oxide, for example, 2,4,6-trimethylbenzoyldiphenylphosphine oxide, bisacylophosphine oxide, phenylglyoxyl ester, camphorquinone, alpha-aminoalkylphenone, alpha,alpha-dialkoxyacetophenone, 1-[4-(phenylthio)phenyl]octane-1,2-dione 2-(O-benzoyloxime), alpha-hydroxyalkylphenone, and the like.

The hologram recording medium of the embodiment may include 1 wt % to 80 wt % of the polymer matrix or the precursor thereof; 1 wt % to 80 wt % of the photoreactive monomer; and 0.1 wt % to 20 wt % of the photoinitiator. When the photopolymer composition further includes an organic solvent as described hereinafter, the content of the above-mentioned components is based on the sum of the above-mentioned components (the sum of the components excluding the organic solvent).

Meanwhile, the hologram recording medium may further include at least one selected from the group consisting of a phosphate-based compound and a low refractive fluorine-based compound.

The phosphate-based compound and the low refractive fluorine-based compound have a lower refractive index than the photoreactive monomer, thereby lowering the refractive index of the polymer matrix and maximizing the refractive index modulation of the photopolymer composition. Moreover, the phosphate-based compound serves as a plasticizer to lower the glass transition temperature of the polymer matrix, thereby increasing mobility of the photoreactive monomer and low refractive components, and contributing to the improvement of moldability of the photopolymer composition.

More specifically, the low refractive fluorine-based compound is stable with little reactivity and has a low refractive index. Therefore, the refractive index of the polymer matrix may be lowered when the fluorine-based compound is added into the photopolymer composition, thereby maximizing the refractive index modulation with the monomer.

The fluorine-based compound may include at least one functional group selected from the group consisting of an ether group, an ester group and an amide group, and at least two difluoromethylene groups. More specifically, the fluorine-based compound may have a structure represented by the following Chemical Formula 4 in which a functional group including an ether group is bonded to both terminal ends of a central functional group including a direct bond between two difluoromethylene groups or an ether bond.

[Chemical Formula 4]

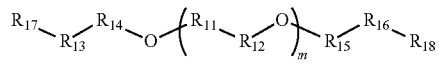

In Chemical Formula 4, $R_{11}$ and $R_{12}$ are each independently a difluoromethylene group, $R_{13}$ and $R_{16}$ are each independently a methylene group, $R_{14}$ and $R_{15}$ are each independently a difluoromethylene group, and $R_{17}$ and $R_{18}$ are each independently a polyalkylene oxide, and m is an integer of 1 or more, 1 to 10, or 1 to 3.

Preferably in Chemical Formula 4, $R_{11}$ and $R_{12}$ are each independently a difluoromethylene group, $R_{13}$ and $R_{16}$ are each independently a methylene group, $R_{14}$ and $R_{15}$ are each independently a difluoromethylene group, and $R_{17}$ and $R_{18}$ are each independently a 2-methoxyethoxymethoxy group, and m is an integer of 2.

The fluorine-based compound may have a refractive index of less than 1.45, or 1.3 or more and less than 1.45. As described above, since the photoreactive monomer has a refractive index of 1.5 or more which is higher than that of the fluorine-based compound, the refractive index of the polymer matrix may be lowered, thereby maximizing the refractive index modulation with the monomer.

Specifically, the fluorine-based compound content may be 30 to 150 parts by weight, or 50 to 110 parts by weight based on 100 parts by weight of the photoreactive monomer.

When the fluorine-based compound content is excessively decreased based on 100 parts by weight of the photoreactive monomer, the refractive index modulation value after recording may be lowered due to a lack of low refractive components. When the content is excessively increased, haze may be generated due to poor compatibility with other components or some fluorine-based compounds may be eluted to the surface of the coating layer.

The fluorine-based compound may have a weight average molecular weight (measured by GPC) of 300 or more, or 300 to 1000. A specific method of measuring the weight average molecular weight is as described above.

Specific examples of the phosphate-based compound include triphenyl phosphate, tricresyl phosphate, cresyldiphenyl phosphate, octyldiphenyl phosphate, diphenyl biphenyl phosphate, trioctyl phosphate, tributyl phosphate and the like.

The phosphate-based compound may be added together with the fluorine-based compound at a weight ratio of 1:5 to 5:1. The phosphate-based compound may have a refractive index of less than 1.5 and a molecular weight of 700 or less.

The hologram recording medium may further include a photosensitizing dye. The photosensitizing dye serves as a photosensitizing pigment to sensitize the photoinitiator. More specifically, the photosensitizing dye may be stimulated by the light irradiated on the photopolymer composition and may also serve as an initiator to initiate polymerization of the monomer and the cross-linking monomer. The photopolymer composition may contain 0.01 wt % to 30 wt %, or 0.05 wt % to 20 wt % of the photosensitizing dye.

Examples of the photosensitizing dye are not particularly limited, and various compounds commonly known in the art can be used. Specific examples of the photosensitizing dye include sulfonium derivative of ceramidonine, new methylene blue, thioerythrosine triethylammonium, 6-acetylamino-2-methylceramidonin, eosin, erythrosine, rose bengal, thionine, basic yellow, Pinacyanol chloride, Rhodamine 6G, Gallocyanine, ethyl violet, Victoria blue R, Celestine blue, QuinaldineRed, Crystal Violet, Brilliant Green, Astrazon orange G, Darrow Red, Pyronin Y, Basic Red 29, pyrylium iodide, Safranin O, Cyanine, Methylene Blue, Azure A, or a combination of two or more thereof.

An organic solvent may be used in the production of the hologram recording medium. Examples of the organic solvent include ketones, alcohols, acetates, ethers, and a mixture of two or more thereof.

Specific examples of the organic solvent include ketones such as methyl ethyl ketone, methyl isobutyl ketone, acetylacetone or isobutyl ketone; alcohols such as methanol, ethanol, n-propanol, i-propanol, n-butanol, i-butanol or t-butanol; acetates such as ethyl acetate, i-propyl acetate, or polyethylene glycol monomethyl ether acetate; ethers such as tetrahydrofuran or propylene glycol monomethyl ether; or a mixture of two or more thereof.

The organic solvent may be added at the time of mixing the respective components contained in the photopolymer composition for producing the hologram recording medium, or may be contained in the photopolymer composition by adding the respective components dispersed or mixed in an organic solvent. When the content of the organic solvent in the photopolymer composition is too low, flowability of the photopolymer composition may be lowered, resulting in the occurrence of defects such as striped patterns on the finally produced film. In addition, when too much organic solvent is added, the solid content is lowered, and coating and film formation are not sufficient, so that physical properties and surface characteristics of the film may be deteriorated and defects may occur during the drying and curing process. Thus, the photopolymer composition may include an organic solvent such that the total solid content concentration of the components contained is 1 wt % to 70 wt %, or 2 wt % to 50 wt %.

The photopolymer composition may further include other additives, catalysts, and the like. For example, the photopolymer composition may include a catalyst which is commonly known for promoting polymerization of the polymer matrix or the photoreactive monomer. Examples of the catalyst include tin octanoate, zinc octanoate, dibutyltin dilaurate, dimethylbis[(1-oxoneodecyl)oxy]stannane, dimethyltin dicarboxylate, zirconium bis(ethylhexanoate), zirconium acetylacetonate, p-toluenesulfonic acid, or tertiary amines such as 1,4-diazabicyclo[2.2.2]octane, diazabicyclononane, diazabicyclo undecane, 1,1,3,3-tetramethylguanidine, 1,3,4,6,7,8-hexahydro-1-methyl-2H-pyrimido(1,2-a) pyrimidine, and the like.

Examples of the other additives include a defoaming agent, and the defoaming agent may be a silicone-based reactive additive, for example, Tego Rad 2500.

The hologram recording medium can realize a refractive index modulation value (n) of 0.020 or more, 0.021 or more, or 0.020 to 0.035 even at a thickness of 5 μm to 30 μm.

Further, the hologram recording medium may have a diffraction efficiency of 50% or more, 85% or more, or 85 to 99% at a thickness of 5 μm to 30 μm.

In the photopolymer composition for producing the hologram recording medium, the respective components contained therein are homogeneously mixed, dried and cured at a temperature of 20° C. or higher, and then predetermined exposure procedures are undertaken, thereby producing a hologram recording medium for optical application in the entire visible range and the near ultraviolet region (300 to 800 nm).

In the photopolymer composition, the components for forming the polymer matrix or the precursor thereof may be first homogeneously mixed, and then the silane cross-linking agent may be mixed with the catalyst to prepare holograms.

In the photopolymer composition, a mixing device, a stirrer, a mixer, or the like which are commonly used in the art can be used for mixing the respective components contained therein without particular limitation. The temperature in the mixing process may be 0° C. to 100° C., preferably 10° C. to 80° C., particularly preferably 20° C. to 60° C. .

Meanwhile, the components for forming the polymer matrix or the precursor thereof in the photopolymer composition are first homogenized and mixed to obtain a liquid formulation that is cured at a temperature of 20° C. or more. The curing temperature may vary depending on the composition of the photopolymer and the curing is promoted, for example, by heating at a temperature of from 30° C. to 180° C.

At the time of curing, the photopolymer may be in state of being injected into or coated onto a predetermined substrate or mold.

Meanwhile, as the method of recording a visual hologram on a hologram recording medium produced from the photopolymer composition, generally known methods can be used without particular limitation. The method described in the holographic recording method of the embodiment described hereinafter can be adopted as an example.

According to another embodiment of the present disclosure, a holographic recording method may be provided, which includes selectively polymerizing photoreactive monomers contained in the photopolymer composition using a coherent laser.

As described above, through the process of mixing and curing the photopolymer composition, it is possible to produce a medium in which no visual hologram is recorded, and a visual hologram can be recorded on the medium through a predetermined exposure process.

A visual hologram can be recorded on the media provided through the process of mixing and curing the photopolymer composition, using known devices and methods under commonly known conditions.

According to another embodiment of the present disclosure, an optical element including the hologram recording medium may be provided.

Specific examples of the optical element include optical lenses, mirrors, deflecting mirrors, filters, diffusing screens, diffraction elements, light guides, waveguides, holographic optical elements having projection screen and/or mask functions, medium of optical memory system and light diffusion plate, optical wavelength multiplexers, reflection type, transmission type color filters, and the like.

An example of the optical element including the hologram recording medium may include a hologram display device.

The hologram display device includes a light source unit, an input unit, an optical system, and a display unit. The light source unit is a part that irradiates a laser beam used for providing, recording, and reproducing three-dimensional image information of an object in the input unit and the display unit. Further, the input unit is a part that previously inputs three-dimensional image information of an object to be recorded on the display unit, and for example, three-dimensional information of an object such as the intensity and phase of light for each space can be input into an electrically addressed liquid crystal SLM, wherein an input beam may be used. The optical system may include a mirror, a polarizer, a beam splitter, a beam shutter, a lens, and the like. The optical system can be distributed into an input beam for sending a laser beam emitted from the light source unit to the input unit, a recording beam for sending the laser beam to the display unit, a reference beam, an erasing beam, a reading beam, and the like.

The display unit can receive three-dimensional image information of an object from an input unit, record it on a hologram plate composed of an optically addressed SLM, and reproduce the three-dimensional image of the object. Herein, the three-dimensional image information of the object can be recorded via interference of the input beam and the reference beam. The three-dimensional image information of the object recorded on the hologram plate can be reproduced into a three-dimensional image by the diffraction pattern generated by the reading beam. The erasing beam can be used to quickly remove the formed diffraction pattern. Meanwhile, the hologram plate can be moved between a position at which a three-dimensional image is input and a position at which a three-dimensional image is reproduced.

Advantageous Effects

According to the present disclosure, provided are a hologram recording medium having a high refractive index modulation value with a thin thickness and improved durability against temperature and humidity, an optical element including the same and a holographic recording method using the hologram recording medium.

DETAILED DESCRIPTION OF THE EMBODIMENTS

Hereinafter, the present invention will be explained in detail with reference to the following examples. However, these examples are only to illustrate the invention, and the scope of the invention is not limited thereto.

PREPARATION EXAMPLES

Preparation Example 1: Synthesis of Polyol 34.5 g of methyl acrylate, 57.5 g of butyl acrylate and 8 g of 4-hydroxybutyl acrylate were placed in a 2 L jacket reactor and diluted with 150 g of ethyl acetate. Stirring was continued for about 1 hour while maintaining the temperature of the jacket reactor at 60 to 70° C. Then, 0.035 g of n-dodecyl mercaptan was further added to the reactor, followed by further stirring for about 30 minutes. Thereafter, 0.04 g of AIBN (2,2'-azo-bisisobutyronitrile) as a polymerization initiator was added thereto, and polymerization was continued for about 4 hours at a temperature of about 70° C. until the residual acrylate-based monomer content became 1 wt % to synthesize a polyol. The obtained polyol had a weight average molecular weight using polystyrene calibration measured by GPC of about 700,000 and OH equivalent weight measured by a KOH titration method of 1802 g/OH mol.

Preparation Example 2: Preparation of Non-Reactive Low Refractive Material 2

20.51 g of 2,2'-((oxybis(1,1,2,2-tetrafluoroethane-2,1-diyl))bis(oxy))bis(2,2-difluoroethan-1-ol was placed in a 1000 ml flask, dissolved in 500 g of tetrahydrofuran, and 4.40 g of sodium hydride (60% dispersion in mineral oil) was gently added several times while stirring at 0° C. After stirring at 0° C. for 20 minutes, 12.50 ml of 2-methoxyethoxymethyl chloride was slowly dropped. When all of the reactants were confirmed to be consumed by $^1$H NMR, the reaction solvent was completely removed under reduced pressure. The organic layer was collected by extracting three times with 300 g of dichloromethane. Thereafter, it was filtered with magnesium sulfate, and all dichloromethane was removed under reduced pressure to obtain 29 g of a liquid product having a purity of 95% or more at a yield of 98%.

Preparation Example 3: Preparation of (Meth)Acrylate-Based (Co)Polymer Having a Silane-Based Functional Group in a Branched Chain 69.3 g of butyl acrylate and 20.7 g of KBM-503 (3-methacryloxypropyltrimethoxysilane) were placed in a 2 L jacket reactor and diluted with 700 g of ethyl acetate. The reaction temperature was set at about 70° C. and stirring was continued for about 1 hour. 0.02 g of n-dodecyl mercaptan was further added thereto, and stirring was further continued for about 30 minutes. Thereafter, 0.06 g of AIBN as a polymerization initiator was added thereto, and polymerization was continued for 4 hours or more at the reaction temperature until the residual acrylate content became less than 1% to obtain a (meth)acrylate-based (co)polymer having a silane-based functional group in a branched chain (the weight average molecular weight was about 900,000, and the equivalent weight of Si—(OR)$_3$ was 1019 g/ea).

Preparation Example 4: Preparation of Silane Cross-Linking Agent 19.79 g of KBE-9007 (3-isocyanatopropyltriethoxysilane), 12.80 g of PEG-400 and 0.57 g of DBTDL were placed in a 1000 ml flask, and diluted with 300 g of tetrahydrofuran. After stirring at room temperature until all of the reactants were confirmed to be consumed by TLC, the reaction solvent was completely removed under reduced pressure.

28 g of a liquid product having a purity of 95% or more was separated at a yield of 91% through column chromatography under a developing solution (dichloromethane: methyl alcohol=30:1) to obtain the above-mentioned silane cross-linking agent.

Examples and Comparative Example: Preparation of Photopolymer Composition

Examples 1 to 2 and Comparative Example 1

The polyol of Preparation Example 1, the photoreactive monomer (high refractive acrylate, refractive index of 1.600, HR6022, manufactured by Miwon), safranin O (dye, manufactured by Sigma-Aldrich), the non-reactive low refractive material of Preparation Example 2, tributyl phosphate (TBP, molecular weight of 266.31, refractive index of 1.424, manufactured by Sigma-Aldrich), Ebecryl P-115 (manufactured by SK entis), Borate V (manufactured by Spectra group), Irgacure 250 (manufactured by BASF) and methyl isobutyl ketone (MIBK) were mixed with light blocked, and stirred with a paste mixer for about 10 minutes to obtain a transparent coating solution.

MFA-75X (hexamethylene diisocyanate, diluted to 75 wt % in xylene, manufactured by Asahi Kasei) was added to the coating solution and further stirred for 5 to 10 minutes. DBTDL (dibutyltin dilaurate) as a catalyst was added thereto and stirred for about 1 minute. It was coated on a TAC substrate (80 μm) using a meyer bar to a thickness of 7 μm, and then cured at 40° C. for 1 hour.

Examples 3 and 4

As shown in Table 1 below, the (meth)acrylate-based (co)polymer having a silane-based functional group in a branched chain obtained in Preparation Example 3, the photoreactive monomer (high refractive acrylate, refractive index of 1.600, HR6022, manufactured by Miwon), the non-reactive low refractive material of Preparation Example 2, tributyl phosphate (TBP, molecular weight of 266.31, refractive index of 1.424, manufactured by Sigma-Aldrich), safranin 0 (dye, manufactured by Sigma-Aldrich), Ebecryl P-115 (manufactured by SK entis), Borate V (manufactured by Spectra group), Irgacure 250 (manufactured by BASF), and methyl isobutyl ketone (MIBK) were mixed with light blocked, and stirred with a paste mixer for about 10 minutes to obtain a transparent coating solution.

The above-described silane cross-linking agent of Preparation Example 4 was added to the coating solution, and further stirred for 5 to 10 minutes. Thereafter, DBTDL as a catalyst was added to the coating solution, and stirred for about 1 minute. Then, the coating solution was coated on a TAC substrate (80 μm) using a meyer bar to a thickness of 7 μm, and dried at 40° C. for 1 hour.

Experimental Examples: Holographic Recording (1) The photopolymer(hologram recording medium)-coated surfaces prepared in each of Examples and Comparative Example were laminated on a slide glass, and fixed so that a laser first passed through the glass surface at the time of recording.

(2) Measurement of Main Relaxation Temperature (Tr) Using DMA

The phase angle of the hologram recording medium was measured in a film state before recording by using DMA (dynamic mechanical analysis) in a range of −80° C. to 30° C. under conditions of a strain of 0.1%, a frequency of 1 Hz, and a heating rate of 5° C./min.

The phase angle is an angular value of tan delta calculated as G"(loss modulus)/G'(storage modulus), and the larger the phase angle, the higher the viscous characteristic of the material.

The main relaxation temperature (Tr) was defined as a point where a rate of change of phase angle with respect to temperature is the largest. Tr values of the hologram recording media obtained in Examples and Comparative Example were confirmed.

(3) Measurement of Diffraction Efficiency (η)

A holographic recording was done via interference of two interference lights (reference light and object light), and a transmission-type recording was done so that the two beams were incident on the same side of the sample. The diffraction efficiencies change with the incident angle of the two beams, and become non-slanted when the incident angles of the two beams are the same. In the non-slanted recording, the diffraction grating is generated perpendicularly to the film because the incident angles of the two beams are equal to a normal line.

The recording (2θ=45°) was done in a transmission-type non-slanted manner using a laser with a wavelength of 532 nm, and the diffraction efficiency (η) was calculated according to the following Equation 1.

$$\eta = \frac{P_D}{P_D + P_T} \quad \text{[Equation 1]}$$

In Equation 1, η is a diffraction efficiency, $P_D$ is an output amount (mW/cm$^2$) of the diffracted beam of a sample after recording, and $P_T$ is an output amount (mW/cm$^2$) of the transmitted beam of the recorded sample.

(4) Measurement of Refractive Index Modulation Value (η)

The lossless dielectric grating of the transmission-type hologram can calculate the refractive index modulation value (Δn) from the following Equation 2.

$$\eta(DE) = \sin^2\left(\sqrt{v^2}\right) = \sin^2\left(\frac{\pi \Delta n d}{\lambda \cos\theta}\right) \quad \text{[Equation 2]}$$

In Equation 2, d is a thickness of the photopolymer layer, Δn is a refractive index modulation value, η(DE) is a diffraction efficiency, and λ is a recording wavelength.

| | | Example 1 | Example 2 | Example 3 | Example 4 | Comp. Ex. 1 |
|---|---|---|---|---|---|---|
| Polyol | Prep. Ex. 1 | 26.2 | 26.2 | | | 40.1 |
| Isocyanate | MFA-75X | 6.4 | 6.4 | | | 9.8 |
| (Meth)acrylate-based copolymer | Prep. Ex. 3 | | | 23.1 | 23.1 | |
| Linear silane cross-linking agent | Prep. Ex. 4 | | | 8.4 | 8.4 | |
| Photoreactive monomer | HR6022 | 31.0 | 31.0 | 31.5 | 31.5 | 47.4 |

-continued

|  |  | Example 1 | Example 2 | Example 3 | Example 4 | Comp. Ex. 1 |
| --- | --- | --- | --- | --- | --- | --- |
| Dye | safranin O | 0.1 | 0.1 | 0.1 | 0.1 | 0.1 |
| Amine | Ebecryl P-115 | 1.7 | 1.7 | 1.7 | 1.7 | 1.7 |
| Borate salt | Borate V | 0.3 | 0.3 | 0.3 | 0.3 | 0.3 |
| Onium salt | Irgacure 250 | 0.1 | 0.1 | 0.1 | 0.1 | 0.1 |
| Non-reactive plasticizer (TBP) | Tributyl phosphate | 0 | 16.9 | 0 | 17.2 |  |
| Non-reactive low refractive material (P3) | Prep. Ex. 2 | 33.8 | 16.9 | 34.4 | 17.2 |  |
| Catalyst | DBTDL(dibutyltin dilaurate) | 0.02 | 0.02 | 0.02 | 0.02 | 0.02 |
| Additive | Tego Rad 2500 | 0.3 | 0.3 | 0.3 | 0.3 | 0.5 |
| Solvent | MIBK | 400 | 400 | 300 | 300 | 400 |
| Coating thickness (unit: μm) |  | 7 | 7 | 7 | 7 | 7 |
| Δn |  | 0.024 | 0.030 | 0.027 | 0.030 | 0.012 |
| Tr (° C.) |  | −15 | −24 | −37 | −41 | 13 |

\*\* The non-reactive plasticizer: Tributyl phosphate (molecular weight of 266.31, refractive index of 1.424, manufactured by Sigma-Aldrichch)

As shown in Table 1 above, it was confirmed that the hologram recording media of Examples 1 to 4 having a main relaxation temperature (Tr) of 0° C. or less can achieve a refractive index modulation value (Δn) of 0.024 or more, wherein the Tr is a point where a rate of change of phase angle with respect to temperature is the largest in a range of −80° C. to 30° C. in dynamic mechanical analysis.

On the contrary, it was confirmed that the hologram recording medium of Comparative Example 1 in which the Tr is 13° C. had a relatively low diffraction efficiency as compared with Examples.

The invention claimed is:

1. A hologram recording medium having a main relaxation temperature (Tr) of 0° C. or less, wherein the Tr is a point where a rate of change of phase angle with respect to temperature is the largest in a range of −80° C. to 30° C. in dynamic mechanical analysis,
    wherein the dynamic mechanical analysis is performed under conditions of a strain of 0.1%, a frequency of 1 Hz, and a heating rate of 5° C/min, and the phase angle is an angular value of tan delta calculated as G"(loss modulus)/G'(storage modulus),
    wherein the hologram recording medium comprises a polymer matrix or a precursor thereof; and a photoreactive monomer, and
    wherein the polymer matrix or the precursor thereof comprises a (meth)acrylate-based (co)polymer having a silane-based functional group in a branched chain, and a silane cross-linking agent.

2. The hologram recording medium of claim 1, wherein the hologram recording medium further comprises a photoinitiator.

3. The hologram recording medium of claim 1,
    wherein the hologram recording medium further comprises at least one selected from the group consisting of a phosphate-based compound and a low refractive fluorine-based compound.

4. The hologram recording medium of claim 3,
    wherein the low refractive fluorine-based compound comprises at least one functional group selected from the group consisting of an ether group, an ester group and an amide group; and at least two difluoromethylene groups.

5. The hologram recording medium of claim 3,
    wherein the low refractive fluorine-based compound has a refractive index of less than 1.45.

6. The hologram recording medium of claim 1, wherein the polymer matrix has a refractive index of 1.45 to 1.70.

7. The hologram recording medium of claim 1,
    wherein the silane cross-linking agent comprises a linear polyether main chain having a weight average molecular weight of 100 to 2000 and a silane-based functional group bound to the main chain as a terminal group or a branched chain.

8. The hologram recording medium of claim 1,
    wherein the photoreactive monomer comprises a polyfunctional (meth)acrylate monomer having a refractive index of 1.5 or more, or a monofunctional (meth)acrylate monomer having a refractive index of 1.5 or more.

9. An optical element comprising the hologram recording medium of claim 1.

10. A holographic recording method comprising selectively polymerizing photoreactive monomers contained in the photopolymer composition of claim 1 by electromagnetic radiation.

* * * * *